US008895652B2

(12) United States Patent
Agrawal et al.

(10) Patent No.: US 8,895,652 B2
(45) Date of Patent: Nov. 25, 2014

(54) HIGH REFRACTIVE INDEX MATERIALS AND COMPOSITES

(75) Inventors: Anoop Agrawal, Tucson, AZ (US); John P Cronin, Tucson, AZ (US)

(73) Assignee: Ajjer, LLC, Tucson, AZ (US)

( * ) Notice: Subject to any disclaimer, the term of this patent is extended or adjusted under 35 U.S.C. 154(b) by 670 days.

(21) Appl. No.: 12/607,281

(22) Filed: Oct. 28, 2009

(65) Prior Publication Data

US 2010/0044640 A1 Feb. 25, 2010

Related U.S. Application Data

(63) Continuation-in-part of application No. 12/136,407, filed on Jun. 10, 2008, now abandoned.

(60) Provisional application No. 61/110,530, filed on Oct. 31, 2008, provisional application No. 60/934,247, filed on Jun. 12, 2007.

(51) Int. Cl.
| | | |
|---|---|---|
| C08K 3/20 | (2006.01) | |
| G02B 19/00 | (2006.01) | |
| C08G 59/30 | (2006.01) | |
| G02B 27/09 | (2006.01) | |
| H01L 33/56 | (2010.01) | |
| C08K 3/22 | (2006.01) | |
| H01L 33/50 | (2010.01) | |

(52) U.S. Cl.
CPC ........ *G02B 27/0955* (2013.01); *G02B 19/0095* (2013.01); *G02B 19/0014* (2013.01); *H01L 33/56* (2013.01); *C08K 3/22* (2013.01); *C08G 59/30* (2013.01); *H01L 33/501* (2013.01); *G02B 19/0061* (2013.01)
USPC ............ 524/430; 524/394; 524/395; 524/396

(58) Field of Classification Search
USPC .................... 524/394, 395, 396, 430
See application file for complete search history.

(56) References Cited

U.S. PATENT DOCUMENTS

| | | | | |
|---|---|---|---|---|
| 6,468,495 | B1 * | 10/2002 | Fields et al. ............... | 423/499.1 |
| 7,709,635 | B2 * | 5/2010 | Davis, Jr. ................... | 540/541 |
| 2003/0021566 | A1 | 1/2003 | Shustack et al. | |
| 2004/0233537 | A1 | 11/2004 | Agrawal et al. | |
| 2008/0134939 | A1 | 6/2008 | Arpac et al. | |
| 2008/0209876 | A1 * | 9/2008 | Miller ........................... | 55/522 |
| 2008/0241040 | A1 * | 10/2008 | Clothier et al. ............. | 423/263 |
| 2008/0311380 | A1 | 12/2008 | Agrawal | |
| 2009/0292105 | A1 * | 11/2009 | Michot ......................... | 528/391 |
| 2010/0291374 | A1 * | 11/2010 | Akarsu et al. ............... | 428/328 |

FOREIGN PATENT DOCUMENTS

| | | | |
|---|---|---|---|
| WO | WO 2007/068822 | * | 6/2007 |
| WO | WO/2010/003138 | | 7/2010 |

OTHER PUBLICATIONS

Taekyung Yu et al; Large-Scale Nonhydrolytic Sol-Gel Synthesis of Uniform-Sized Ceria Nanocrystals with Spherical, Wire, and Tadpole Shapes Angewandte CHemie International Edition, 44 (45), 7411, (2005).
P. Wang et al, Gelation of Ionic Liquid-Based Electrolytes with Silica Nanoparticles for Quasi-Solid-State Dye-Sensitized Solar Cells, J. Am. Chem. Soc., 125, p. 1166-1167 (2003).
M.A. Neuoze et al, A route to heat resistant solid membranes with performances of liquid electrolytes, Chemical communication, p. 1082-1084 (2005).
Modern Plastics Encyclopedia (McGraw Hill, New York, NY).
Domingo Garcia Cuadrado et al, Stille reaction on pyridinium cation,. Synthetic letters, 11, 1904-1906 (2002).
Deetlefs, M. et al; Neotric Optical Media for Refractive Index Determination of Gems and Minerals, New J. Chem, 30, p. 317 (2006).
Thomas A. Logothetis et al, Crysatl engineering of brominated tectons: N-methyl-3, 5-dibromopyridinium iodide gives particularly short C—BrI halogen bonding, New J. Chem., 28, 760-763 (2004).
Extracting More Light from LEDs, Lighting Research Center, Rensselaer Polytechnic Institute.
Frank W. Mont et al, High-refractive-index TiO2-nanoparticle-loaded encapsulants for light-emitting diodes, Journal of Applied Physics 103, 083120 (2008).
Steve G. Johnson, Prediction of light extraction efficiency of LEDs by ray trace simulation, Third International Conference on Solid State Lighting, edited by Ian T. Ferguson, Nadarajah Narendran, Steven P. DenBaars, John C. Carrano, Proc. of SPIE vol. 5187.

* cited by examiner

*Primary Examiner* — Peter Szekely (57) ABSTRACT

This invention discloses composite materials utilizing high refractive index materials and their use with phosphors, LED packaging and as fillers in polymers and in polymer blends.

3 Claims, 5 Drawing Sheets

HIGH REFRACTIVE INDEX MATERIALS AND COMPOSITES

RELATED APPLICATION/CLAIM OF PRIORITY

This application is related to and claims priority from Provisional application Ser. No. 61/110,530 on Oct. 31, 2008, which provisional application is incorporated by reference herein. This application is also a continuation-in-part (CIP) of [pending] non provisional application Ser. No. 12/136,407, filed Jun. 10, 2008 (published as 20080311380, and now abandoned), which non provisional application claims the priority of application Ser. No. 60/934,247, filed Jun. 12, 2007, and which non provisional application is also incorporated by reference herein.

FIELD OF THE INVENTION

The present invention relates to forming high refractive index materials and use of these in composites for optical applications.

BACKGROUND OF THE INVENTION

In many optical applications composites are required to achieve a desired performance. For some applications the optical clarity of these composites is important. Presence of particles in optical composites can compromise clarity due to the scattering of light, which is caused by a mismatch of the refractive index (RI or index) of the particles and the matrix. Some of the applications now are increasingly using materials that are of high refractive index, such as semiconductors, phosphors used in displays and lighting (e.g., light emitting diode packaging), and with high RI polymeric materials to match the index of these particles will be desirable. While in some other cases, it is desirable to have high index polymeric or organic materials that may be added to the lower index polymer matrices so that opaque composite materials will result.

An object of the present invention is to teach how high index materials that are predominantly organics can be made and used for optical composites that can be used in a variety of applications.

SUMMARY OF THE INVENTION

In accordance with the purposes of the present invention, as embodied and broadly described herein, the present invention provides methods of forming high refractive index materials, and their applications.

BRIEF DESCRIPTION OF THE DRAWINGS

FIG. 3—Schematic encapsulation of (a) an LED and (b) an LED array

FIG. 4—Schematics of LED encapsulation (a) without phosphor and (b) with phosphor in the encapsulant;

FIG. 5—Schematics of an opaque polymer composite formed by dispersing high index particles in a low refractive index matrix (a) when high index nanoparticles are used and (b) when high index ionic particles are used.

DETAILED DESCRIPTION

Figure 1:
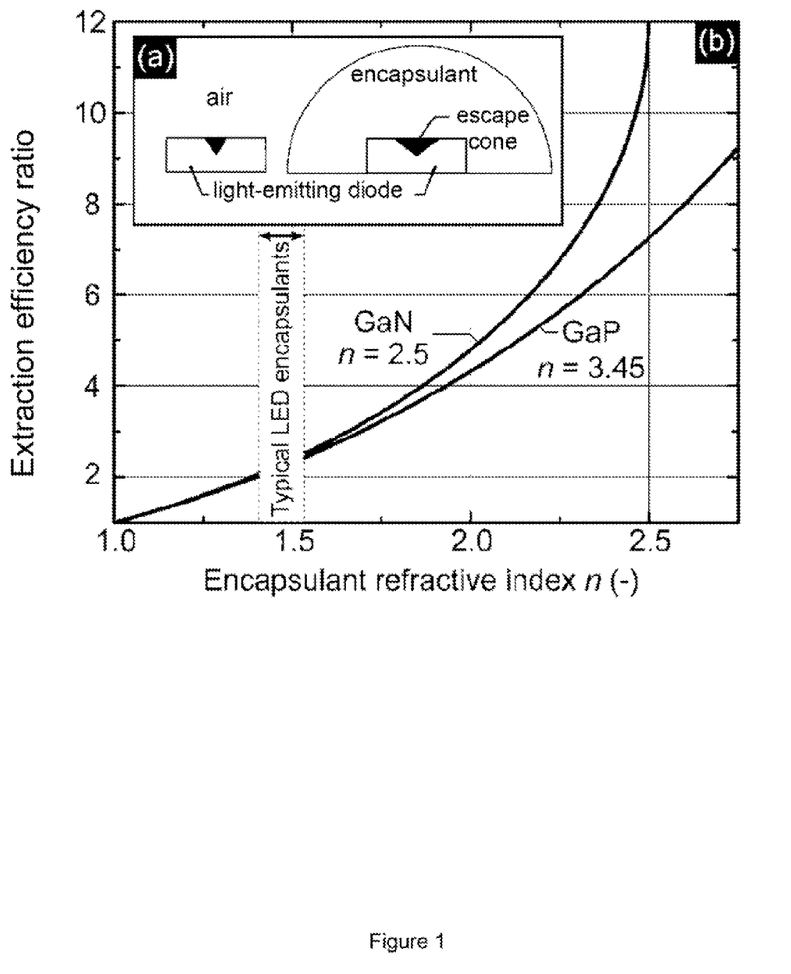
FIG. 1—Increase in light extraction capability with increasing encapsulant index for an LED.

Many light emitting diodes (LEDs) and display applications comprise of phosphors that are embedded in a matrix. Typically these phosphors, e.g., YAG:Ce have a high refractive index (~1.85) and they are embedded in low RI matrices of refractive index below 1.6 such as silicones. The blue or UV light emitted from the semiconductor chip is converted to white light as it strikes these phosphor particles. The scattering of light caused by the mismatch between the phosphor and the matrix results in halos and reduces the color fidelity. In addition, the semiconductor used to produce light for LEDs, are high in refractive index, and the light extraction efficiency from the semiconductor surface into the encapsulant is limited by the low refractive index of the encapsulant (see FIG. 1). Thus higher refractive index encapsulants are desirable. Higher refractive index materials are those which have an index equal to or higher than 1.65 in the wavelength of interest. The high index materials of this invention may also be used for other applications such as lenses, coatings, waveguides, optical fibers, etc. In this application high RI materials are desired that are clear or form clear composites.

For another set of applications the high refractive index materials can be used in another way. Many applications requiring common plastics with low refractive index use large sized (average size greater than about 0.1 μm) high refractive index inorganic powders (typically titanium dioxide based materials) as fillers to provide opacity or hiding power. Titanium dioxide based fillers and pigments are available from many sources. Some of these are Tronox Inc (Oklahoma, Okla.), Tioxide pigments from Huntsman (Bellingham, UK) and Dupont Titanium Technologies (Wilmington, Del.). Applications include paints, packaging, fibers, instrument and appliance housings, and a variety of industrial and consumer goods. It is desirable that these fillers/pigments be replaced by other polymers or deformable materials of high refractive index. This will allow rheological advantages of these polymer composites in terms of lowering the viscosity, reducing abrasion on processing equipment and while also allowing flexibility to control the shape of the dispersed phase to provide additional property advantages.

The objective of this innovation are ways to form high RI materials that may be used for applications that require optical clarity or these may be used as particulate fillers in a low refractive index matrix that are opaque or scatter light.

One method that has been used in the industry to make high index materials is by incorporating high index nanoparticles in a polymer matrix. This method has been used primarily for coatings. Another way to make high RI materials is by using high index ionic materials (see published US patent application 20080311380). The current art and then the novelty will be presented. Typically for most applications the range of interest is visible range between 400 and 700 nm, and in the near infra-red between 700 and 2,000 nm. Many of the optical communication systems use about 1560 nm wavelength radiation.

High RI Materials Using Nanoparticles

In one approach the high refractive matrix comprises of high index nano-particles that are pre-formed and are then uniformly mixed (preferably reacted) with a resin material, so that it results in a refractive index of the matrix between the high index particles and the RI of the resin. Some examples of high index are metal oxides that contain one or more of the elements typically selected from Si, Ti, Zr, Al, Ta, Zn, Sn, Sb, Zr, Be, Ce, Pb, Ge, Bi Y, Gd and W. Silicon oxide by itself has low RI but it can be combined with others to get high RI. For example, titanium dioxide may be modified with less than 10% of another oxide such as that of Si, Zr or Ta, etc., to reduce its photooxidation characteristics. The nanoparticles may provide other desirable properties, e.g., electrical conductivity (indium/tin oxide or zinc aluminum oxide or tin antimony oxide), thermal conductivity (e.g., aluminum oxide, aluminum nitride, beryllium oxide) and UV stability (e.g., cerium oxide, zinc oxide).

The inorganic nano-particles of high index particles may be formed by a variety of methods, which include solgel methods or plasma processing methods. Several of the solgel methods are listed by [Yu et al; Taekyung Yu, Jin Joo, Yong Il Park, Taeghwan Hyeon, *Large-Scale Nonhydrolytic Sol-Gel Synthesis of Uniform-Sized Ceria Nanocrystals with Spherical, Wire, and Tadpole Shapes* Angewandte Chemie International Edition, 44(45), 7411, (2005)], solvothermal processes (also called glycothermal processes), reverse micelles, sonochemical methods, microwave heating methods, thermolysis, non-hydrolytic solgel methods (using halide and non-halide precursors). The particles may have a variety of shapes including spherical, ellipsoidal, dendritic, needle like or flake like. For these nano-particles at least one of the dimensions has to be less then 300 nm, and preferably less than 100 nm, and most preferably less than 30 nm.

Preparation of Metal Oxide Nanoparticles and their Surface Modification (Attachment of proper functional groups) is described in many publications (for example, see published US patent application 20080134939). Proper surface modification ensures that the nano-particles are well dispersed in the desired matrix material without aggregation or coagulation. In published US patent application 20080134939 production of nanoparticles is done by carrying out hydrolysis and condensation of metal alkoxides under controlled conditions, and the surface modification with organic groups (e.g., hexoxy) providing amphiphilic properties so that the particles can be dispersed both in polar solvents such as water and non-polar organic solvents. The contents of this published application are included herein by reference.

As another example, Shustack et al (U.S. Patent application 2003/0021566) prepared high refractive index waveguides for telecom wavelengths (1550 nm) by combining nano-particles of ceramics (such as those comprising of titania, zinc and tin of about 20 nm in size) and functionalizing their surfaces so that they may be reacted with acrylics. Their approach was primarily to make thick coatings (~10 microns thick). This application is incorporated herein by reference, The chemistry could be further modified so that the shrinkage is even lower and one can obtain thicker matrices such as from about a mm thick to several cm thick. Preferred matrices are thermosetting as this allows particles to be mixed in low viscosity resins before solidification.

The nanoparticles are made by any method and its surface is functionalized. Further, organic precursors are used to knit these nano-particles into a polymeric matrix or the first polymer (or first polymer composition). This matrix may be a thermosetting or thermoplastic. For thermoset materials that have low degree of shrinkage during polymerization are preferred for encapsulation of the LEDs or as a matrix for the phosphor as they keep the stress within the package low. If thermosets are used to produce material as a high index for the inorganic fillers, then the shrinkage during curing is less of an issue, as this material is pulverized and used as filler in a second polymer (or second polymer composition).

For making high index materials by incorporating nanoparticles in thermoset polymers, the applicant prefers epoxies as organic precursors as these offer lower shrinkage, excellent reactivity control and are available in a range of refractive indices (e.g. from about 1.45 to almost 1.6), so as to be able to cast thick slabs of these with specific R's. One may also use those monomers (for organic precursors) in part or as a complete substitution that expand on polymerization due to the opening of strained rings so as to reduce the shrinkage during cure and hence the interfacial stresses. Some of the expandable monomers are spiroorthocarbonates and oxiranes (e.g. see Sadhir et al and Foussier et al; [(a) Sadhir, et al, Expanding Monomers: Synthesis, Characterization, and Applications by Rajender Kumar Sadhir and Mr. Russell M. Luck, CRC, (publishers) (1992); (b) Fouassier et al: Photoinitiation, Photopolymerization, and Photocuring: Fundamentals and Applications, by Jean-Pierre Fouassier, Hanser Gardner (publishers) (1995)]). Other organic precursors may be used, such as monomers using acrylic chemistry (e.g., acrylates and methacrylates polymerized by UV or heat), urethanes formed by catalyzed reactions of polyols and isocyanates, or silicones such as those comprising of dimethylsiloxane monomers with unsaturated end groups that may be polymerized using platinum catalysts. The functionalization of the particles is dependent on the type of monomers/resin used that can react with them. The polymerization schemes may be thermal or radiative polymerization such as using UV, microwaves and Infra-red (IR). The hardness of the final composite will be determined by the organic precursors molecular weight, their molecular flexibility and the density of crosslinks in the thermoset. All of these can be tailored to get soft materials with an elastic modulus of about 5 MPa to hard materials with a modulus of 3,000 MPa or above at the use temperature.

Depending on their application these materials may be combined with antioxidants, heat and/or UV stabilizers and flame retardants to prolong their use. UV stabilizers are generally dependent on the organic precursor chosen, but the common ones are benzophenones, benzotriazoles, triazine, hindered amines, etc. Some of the antioxidants are hindered phenols and phosphites. Examples of preferred flame retardants are brominated organics. A more exhaustive list of these can be found in Modern Plastics Encyclopedia (McGraw Hill, New York, N.Y.) and Plastics Technology Buyers Guide (Gardner Publications, Cincinnati, Ohio). Suitable monomers such as epoxy and others may be further halogenated or sulfurized to give higher RIs. If the LED emits in the UV to excite the phosphor, then UV stabilizer and the matrix must be chosen carefully so that the desired emitted radiation wavelengths for phosphor excitation are not absorbed by the UV stabilizer. One may also control the natural UV transparency in polymers, e.g. in cycloaliphatic epoxies have lower UV absorption as compared to aromatic epoxies.

Figure 2:
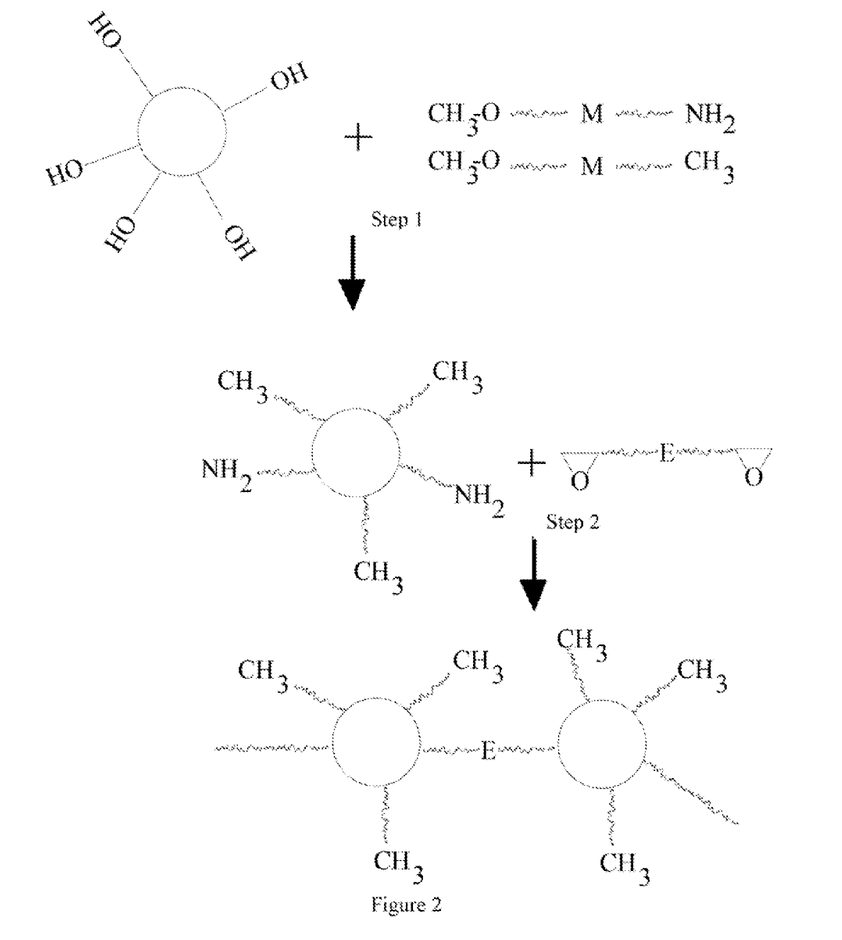
FIG. 2—Functionalization of nano-particles and incorporation in a reactive matrix.

A process schematic showing the formation of a composite with functionalized nano-particles in an epoxy matrix is shown in FIG. 2. Step 1 shows a nano-particle of high index material as formed which is functionalized using a coupling agent. Several coupling agents may be combined together in a solution to treat the nanoparticles to impart the surface functionalization. Depending on the concentration of the different coupling agents and their reactivity, the type and quantity of the various surface ligands on the nanoparticle surface can be controlled. This will then control the compatibility and the reactivity of the nanoparticles in the polymer composition they are dispersed in. These coupling agents may be based on different chemistries and may employ silicon, titanium, aluminum and zirconium. One has to be careful about the amount of reactive groups on the surface of the nano-particles. As these nano-particles can act as centers of hyperbranched structures, and if the loading of the nanoparticles and the surface reactive groups is high, the gel point may occur prematurely, resulting in poor processability. Thus, these may be functionalized using matrix reactive and matrix-nonreactive coupling agents. This will be described in more details using specific examples. Coupling agents such as γ-aminopropyltrimethoxy silane and γ-glycidoxypropyltrimethoxy silane will react with the —OH groups on the surface of the nano-particles at the alkoxy end. The same happens when the amphillic chemistry is used to modify the surfaces. The amine or the glycidoxy end is reactive with epoxy and or curing agents used to cure epoxies. Silanes such as isobutyltrimethoxy silane or methyltriethoxy silane will react with the nano-particles but the organic part does not react with the matrix. Thus one may use mixtures of matrix reactive and matrix non-reactive silanes to control the eventual reactivity of the nano-particles. Also, it is preferred that the silanes are reacted with the nano-particles under acidic conditions so that the silyanols so formed do not condense themselves. Functionalized nano-particles are then isolated and dispersed in the resin. The table below gives a selection of brominated epoxy resins from Dow Chemical Co (Midland, Mich.). These have different levels of bromination, and they may be combined with non-brominated resins such as DER 332 and DER330 to tune the refractive index. Some of these resins are solid or in solvents. One may disperse the functionalized nano-particles in the same solvents as the epoxy resins before mixing with the epoxy solutions.

| Brominated Epoxy Resines | | | | |
|---|---|---|---|---|
| Epoxy | Description | Epoxide Equivalent Weight (g/eq.) on solids | Viscosity (mPa·s @ 25° C.) | Bromine Content (%) |
| D.E.R.™ 593 | Brominated epoxy resin in acetone and DOWANOL* PM. | 350-370 | 400-1100 | 16.5-18 |
| D.E.R. 592-A80 | Brominated epoxy resin in acetone. | 350-370 | 1000-2400 | 16.5-18 |
| D.E.R. 539-A80 | Brominated bisphenol-A type epoxy resin in acetone. | 430-470 | 1000-1600 | 19-21 |
| D.E.R. 539-EK80 | Brominated bisphenol-A type epoxy resin in methyl ethyl ketone (MEK). | 430-470 | 1500-2000 | 19-21 |
| D.E.R. 530-A80 | Brominated bisphenol-A type epoxy resin in acetone. | 425-440 | 1500-2500 | 19.5-21.5 |
| D.E.R. 538-A80 | Brominated bisphenol-A type epoxy resin in acetone. | 465-495 | 800-1800 | Min. 21% |
| D.E.R. 514L-EK80 | Brominated bisphenol-A epoxy resin in methyl ethyl ketone (MEK). | 475-495 | 1250-3000 | 21-22 |
| D.E.R. 542 | Brominated solid epoxy resin. | 305-355 | 52-62) | 46-51 |
| D.E.R. 560 | Brominated solid epoxy resin. | 440-470 | 78-85) | 47-51 |

Also the solid resins could be mixed with anhydrides (e.g., methyl hexa-hydrophtalic anhydride or nadic methyl anhydride) to give low viscosity liquid matrix precursors with 100% resin content. Further, anhydrides may be catalyzed by imidazoles (available from Air Products (Allentown, Pa.), triphosphine imine, etc. The anhydrides can be made in formulations with long pot life (several hours) so as the processing may be controlled well and then cured at elevated temperature (typically between 100 to 150 C) in a single step or multiple stages. These composites may be produced at a factory as "A" staged resin sheets with all the ingredients but not fully cured. They may have to be refrigerated in this stage to ensure its properties do not change. When it is decided on the final shape and size, several of these are thawed and assembled together as a unified block in a desired shape and fully cured. The final curing may even be done in a site remote from the factory where "Stage A" sheets are produced. To produce large thicknesses, one may even use processes to keep adding uncured sheets (A staged) and curing them one at a time.

Returning to FIG. 2, amine on the silanes would be the reactive functionality that is shown to react with epoxy groups to form the matrix. All the condensation reactions (e.g., between the coupling agents and the nanoparticles, or between the organic groups on the nanoparticles to those with the matrix resin components) which result in release of small molecules (water, carbon dioxide, methanol, ethanol, acetic acid, etc) are preferably done in a reaction vessel before all of the other resin components are added to make final formulations for curing. This keeps the shrinkage low and allows one to form thick composites which are fully dense. In step 2 the functionalized materials are woven in the polymeric network. The phosphor particles (if added) may be also functionalized and added before gelation of the matrix, and then this material may be used for LED encapsulation and cured in-situ once it is placed within the final assembly.

Ionic Materials with High RI

Another route to synthesize high refractive index matrices for composites is to rely on the ionic materials with electron rich moieties. This will be explained using a preferred embodiment that results in high RI ionic liquids or low melting point salts (e.g., salts with melting points below 300° C. and preferably below 100° C.). Preferably these ionic liquids are clear, i.e., they are not colored. Those low melting point salts are preferred that solidify by formation glass (amorphous solid) rather than crystallize. Typically the anions and cations of the ILs are large that these do not crystallize and their freezing points are low. Amongst other advantages, usually they do not have a vapor pressure and are non flammable making them useful from an industrial perspective. In a recent publication it was shown that one could make ionic liquids with refractive indices of as high as 2.08 [Deetlefs, et. al. Deetlefs, M., Seddon, K. R., Shara, M., *Neotric Optical Media for Refractive Index Determination of Gems and Minerals*, New J. Chem, 30, p-317 (2006)] but their use in composites were not described. However, according to this study, the materials above 1.833 RI were colored. These ionic liquids were based on imidazolium cations and Br$^-$ and I$^-$ anions and also compound anions formed by mixing bromides and iodides. The ionic liquids present limitless opportunities of blending with other salts and ionic liquids to tailor their RI. For example materials with anions such as $SnX_6$ (where X is Cl or Br) with imidazolium results in high RI. Other preferred anion examples are $CX_3CO_2^-$, $CX_3SO_3^-$ where at least one of the X is Cl, Br, I, alkyl, F or H. Also, to raise the index further, and keep the clarity, the cations may also be made with sulfur, chloride, bromide and iodide moieties. Ionic substances with higher amounts of bromine in the cations can be prepared using standard methodology, for example, N-methyl-4-bromo-pyridinium [Logothetis, et al; Thomas A. Logothetis, Franck Meyer, Pierangelo Metrangolo, Tullio Pilati and Giuseppe Resnati *Crystal engineering of brominated tectons: N-methyl-3,5-dibromopyridinium iodide gives particularly short C—BrI halogen bonding*, New J. Chem., 28, 760-763 (2004)] or N-methyl-3,5-dibromopyridinium [Garcia-Cuadrado et al; Garcia-Cuadrado, Domingo; Cuadro, Ana M.; Alvarez-Builla, Julio; Vaquero, Juan J. *Stille reaction on pyridinium cation*, Synthetic letters, 11, 1904-1906 (2002)]. These are shown below, where "R" is methyl or it may be changed to another alkyl. Combining halogenated anions and cations can lead to materials with high RI. Some examples of halogenated anions are $BiBr_4^+$, $BiCl_4^+$ and compound anions such as $Bi_2Br_{11}^{5+}$ and $Bi_2Cl_{11}^{5+}$. Additives such as stabilizers and antioxidants as discussed above may also be added.

Structure of some exemplary pyridinium cations (above) and the ionic liquid structure based on imidazolium (below)

To obtain materials with exact RI one can mix a lower RI ionic liquid with that of a higher RI ionic liquid. From applicant's work applicant has seen that for ionic liquids to be compatible it is preferable that either one of the anion or cation in the ionic liquids being mixed is similar. Thus, illustrating this as an example using materials mentioned by Deetlefs, et al., 1hexyl-3methylimadazolium dibromoiodate has an RI of 1.685 which could be mixed in any proportion with 1ethyl-3-methylimadazolium dibromoiodate with an RI of 1.83 since the anions of both the materials are the same. To get a refractive index between 1.685 and 1.830 these may be mixed in appropriate proportions. Cations of imidazolium, pyridinium and thiazolium (where one of the nitrogens in imidazolium is substituted by sulfur) with asymmetric substitution on unsaturated ring are of particular interest, preferably those which are electron rich. The non-halide anions of particular interest are sulfoniums, phosphoniums, cyanoammoniums, cyanoborates, bismuthate and phosphates. One can also make ionic liquids and then add salts of metals of high atomic number where these metals may be part of cations or anions. It is preferred that these salts have either the anion or the cation be the same as ionic liquid so that these are soluble or compatible in a wide temperature range. For example when ionic liquid 2-Bromo-1-ethyl-pyridinium tetracyanoborate or 1-(2-bromo-1-(chloromethyl)-1-methylethyl)pyridinium tetracyanoborate is used as a matrix a compatible salt is added to change the RI. Some of the preferred salts will be tetracyanoborate salts of one or more of bismuth, zirconium, titanium, lanthanum, hafnium, scandanium, yttrium, ytterbium and neodymium. As can be seen these metals belong to periods 5, 6 and 7 of the elemental periodic table in chemistry or to the rare-earth series. As another example, if one uses ionic liquids such as phosphonium salts (e.g., see ionic liquids from Cytec Industries sold under the trade name of CYPHOS®, Woodland Park N.J.) one can use soluble salts of the above metals to modify the RI. Some preferred examples of chloride based ionic liquids from Cytec are IL 101 and IL 164 and those based on alkyl phosphate are IL 169. It is preferred (but not necessary) that the anion of the soluble salt matches the anion of the ionic liquid. One may also mix various ionic liquids, e.g. IL 101 and IL 164 to change the viscosity, freezing point or the solubility of salts into the basic ionic matrix. One may also have the same metal present in the anion and also in the cation of the soluble salt or the ionic liquid, e.g., bismuth bismuthate, a salt, may be solubilized in an ionic liquid that is formed by imidazolium cation and bismuthate anion. One can have one or a number of salts as dissolved species in an ionic liquid composition. The ionic liquid composition may have several ionic liquid components. One advantage of several components is to depress the freezing point of the high index composition, so that it retains its liquid state or its plasticizing capability (when used in a solid matrix) in the intended temperature range. Those ionic liquids that are hydrophobic or not miscible with water are preferred so that these are less sensitive to the environment. Although hydrophobicity is influenced by both the anions and cations but a large cation or an anion can shadow the effects of the other. For example IL 101 which is trihexyl(tetradecyl)phosphonium chloride is hydrophobic, and IL 164 (tetrabutyl phosphonium chloride) is less hydrophobic. Although chloride salts are usually hygroscopic, however the larger alkyl substituents on the IL101 cation results in a hydrophobic material. In addition for many semiconductor packing it is preferred to use halogen free materials to avoid corrosion, thus ionic liquids (e.g., IL 169 which is tri(butyl)ethylphosphonium diethylphosphate) and soluble salts that are halogen free are more suitable. Halogen free primarily implies that materials not containing halogen ions, $F^-$, $Cl^-$, $Br^-$ and $I^-$ or compound ions (e.g., $BrI_2^-$, $ClI_2^-$) of these materials.

Since one particular class of application for the high index material is in light emitting diode packages or scintillators, one can add these soluble salts by selecting them by putting additional restrictions. These restrictions being that the cation of the soluble salts to be the same as the cation forming the phosphor embedded in the high index material or of the semiconductor that emits light with which the encapsulant it is in contact with. For example if one uses YAG:Ce as phosphor one may add soluble salts of yttria, aluminum and cerium (or at least matching one of the cations that forms the phosphor or the semiconductor). Further, these may be added in the same proportion as their solubilities or in proportion to their concentration in the phosphor (or the semiconductor) to reduce ionic migration across these materials in order to avoid corrosion. The phosphor particles and the emitting semiconductors are considered as active materials in the LED.

The ionic liquids which are liquid at the temperature of use may be used as liquids or these may be solidified by incorporating polymers or nanoparticles (e.g. fumed silica or fumed alumina). These liquids may also be solidified by adding reactive monomers which polymerize and/or crosslink in situ. The high index the monomer compositions for filling cavities (such as for LED encapsulation) can typically comprise of ionic liquid, nanoparticles, and polymerizable monomers along with optional materials such as phosphors, UV stabilizers, viscosity modifiers, adhesion promoters, surfactants, etc. To keep the polymerization caused shrinkage low, it is preferred that the monomer in the composition in the mixture should be less than 25% by weight of the total and more preferably less than 10%. An example may be use of 2-hydroxy ethyl methacrylate (polyHEMA) with ethylene glycol methacrylate as the crosslinker and an appropriate catalyst such as benzoyl peroxide which are all dissolved in the ionic liquid. Then this liquid composition is placed in the cavity and the polymerization is conducted in-situ, e.g., by heating or radiation.

Polymerization/crosslinking may be done using various chemistries. Some of the preferred mechanisms are reactions between amines and epoxies, amines and isocyanates, isocyanates and hydroxyl groups. Addition reactions may be ring opening polymerizations or through the opening of unsaturated bonds and rings. For low shrinkage it is preferred that those monomers be used which have high molecular weight (e.g., functionalized pre-polymers and oligomers), typically greater than 2,500, and preferably greater than 5,000. Polymeric networks formed by non-hydrolytic solgel route to solidify ionic liquids may be used (Neuoze, M. A., Bideau, J. L., Leroux, F., Veoux, A., *A route to heat resistant solid membranes with performances of liquid electrolytes*, Chemical communication, p-1082-1084 (2005). As an example, in this approach tetramethyl orthosilicate was reacted with formic acid to form the solid. This process could be modified by using in part lower functionality materials such as phenyl dimethylsilane, phenyltrimethoxy silane and phenethyltrimethoxy silane. This reduces the crosslink density to increase elasticity of the network former. Many silanes are also available with reactive end groups such as methacrylates that can provide UV crosslinkable systems. One can also solidify the liquids by using nano-particles such as fumed silica (Wang, P., Zakeeruddin, S. M., Comte, P, Exnar, I., and Gratzel, M. Gelation of Ionic Liquid-Based Electrolytes with Silica Nanoparticles for Quasi-Solid-State Dye-Sensitized Solar Cells, J. Am. Chem. Soc., 125, p-1166-1167 (2003)). In this case a solvent is also added for processability which is then removed during processing after the material is placed or deposited. This may be used in conjunction with non-hydrolytic solgel method described above.

Another way of forming clear solid composites is by the use of those polymers (including copolymers) which result in multi-phase structure, meaning two or more phases. One part of the polymeric chain is readily soluble in the ionic liquid at all temperatures in which the device needs to function, and one other part is insoluble or has low solubility in this temperature range, which forms the second phase. The fall out of the second phase from the solution may result in crystallization of this phase or even a physical or chemical bonding which may require elevated temperature to disperse. Thus, the second phase has a distinct glass transition temperature (Tg) or melting point ($T_m$). As one increases the polymeric content, a viscosity rise is seen, however as the additions continue, suddenly at a particular concentration viscosity rises rapidly to the point of almost being not measurable. This happens when there is sufficient amount of polymer which is able to form a continuous network where the second phases start to connect by polymer chains part of which are compatible with the liquid phase. This is similar to the on-set of gel-point in the formation of crosslinked systems, defined as the first instance when an infinite molecular weight body is first formed. For 2 phase systems, the present invention contemplates a first phase as the one which is more compatible or well dispersed in the liquid phase, and the subsequent phases, such as second phase being less soluble in the liquid phase. At least one of the subsequent phases keeps parts of the polymeric chains physically locked which results in an overall solidification of the electrolyte. One has to be careful that for the clear systems, the formation of multiple phases does not lead to scattering of light. Such systems are more fully described in US patent application US2004/0233537 and in PCT application serial number PCT/US09/49644 (Novel Electrochromic materials, devices and applications of the same, filed on Jul. 2, 2009) which are incorporated herein by reference. Some of the polymers that can form multiple phases are polymers and block copolymers of fluorinated materials, polyolefins, polyureas, polyurethanes, silicones, etc. Some of the fluoropolymers are fluorinated ethylene propylene, copolymers of poly vinylidene fluoride, fluorinated propylene, ethylene, etc.

The use of ionic liquids and low melting point salts to form a solid matrix with high index is novel in itself. Further, the surface of the high index nano-particles themselves may be functionalized with species that are ionic and have at least an anion or a cation in common with the ionic liquid to make these more compatible with each other if a system calls for the combination of the two.

Figure 3:
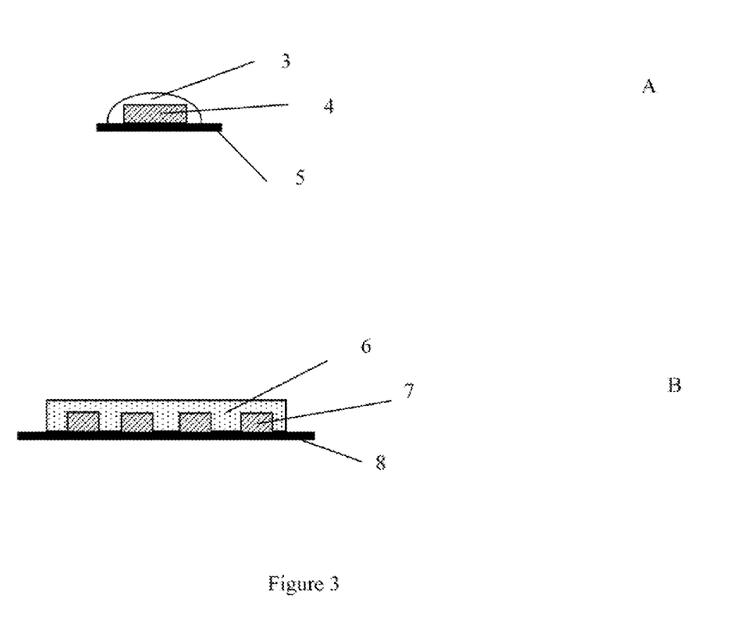
Figure 4A:
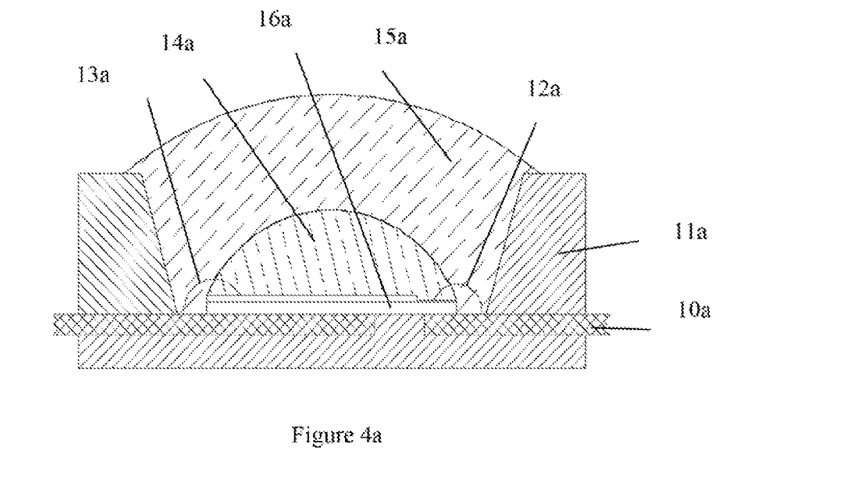
Figure 4B:
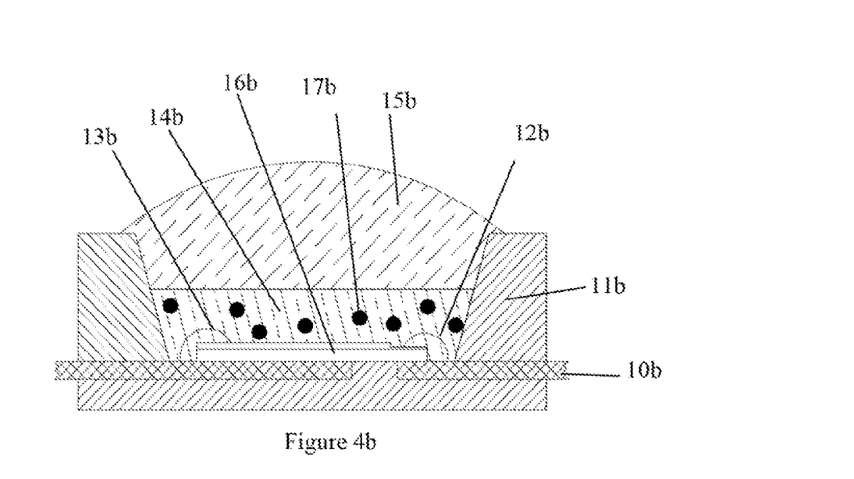

FIG. 3*a* schematic shows an LED 4 on a substrate 5 which is encapsulated with a matrix of high index material 3. This matrix may also be shaped as a lens if desired. FIG. 3*b* schematic shows a display element comprising of several LED elements (or an array) 7 on a substrate 8 which are covered with a high index material 6. An array of LEDs are used to form displays. These high index materials may be used directly or comprise of these materials for use in any optical system where a high index material is required. FIG. 4*a* shows an individual LED package where the emitting semiconductor is shown as 16*a* and this is mounted on a lead frame 10*a* along with a can 11*a*. The semiconductor is electrically wired to the lead frame using connectors 12*a* and 13 *a*. A high index transparent encapsulation material made by this invention 14*a* is placed over the emitting semiconductor, and is then covered for protection by a transparent material 15*a*. If the high index material provides enough environmental and mechanical protection then 15*a* is not required. FIG. 4*b* shows another type of an LED device that emits white light. The emitting semiconductor is 16*b*, which is electrically connected to a lead frame 10*b* via the connections 13*b* and 12*b*. The outside protective can is shown as 11*b*. The high index encapsulant from this invention 14*b* that has phosphor particles 17*b* is placed on top of the emitting semiconductor. The semiconductor emits in blue or UV region, and the phosphors convert this light to other colors so that an observer sees white light emanating from the LED. This encapsulant is then covered with an optional protective layer 15*b*. In both examples i.e., 14*a* and 14*b*, the high index and/or the clear protection layers may be shaped as a lens to direct the light more efficiently.

Use of High Index Materials as Fillers in Low Index Matrices

Figure 5A:
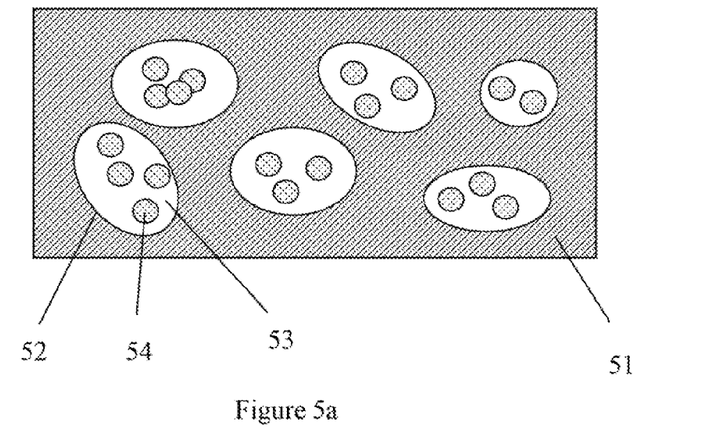

When the high index materials are made using nanoparticles and a polymer (Polymer 1), these are preferably pulverized using cryogenic methods to produce the filler before it is incorporated into a low index matrix (Polymer 2). This pulverization process results in low plastic deformation of the material while it is being powdered. A preferred pulverization temperature is below the first secondary relaxation peak ($T_\beta$) of the Polymer 1 or more preferably below all of the secondary relaxation peaks. Since the nanoparticles will be encased within and preferably bonded to or compatible with this polymer (Polymer 1 may be thermoset or a thermoplastic), the high index of the filler will be maintained. Further, when these fillers are added to another thermoplastic or thermosetting polymers (i.e., Polymer 2) to form a composite, these polymer blends or alloys may be processed at temperatures above or below the glass transition temperature ($T_g$) of the first polymer (Polymer 1). One may also use the same polymer for Polymer 1 and Polymer 2, and still maintain the nanoparticles in the dispersed phase of Polymer 1 only. For example, the nano-particles and monomer that forms Polymer 1 are mixed and cured (or crosslinked to result in high index material), the pulverized particles of which are then blended into the same monomer again and cured, which results in the same polymer for both. FIG. 5a shows schematic representation of the concept where the low refractive index matrix (Polymer 1) is shown as 51, and it has high RI particles 52 which are dispersed. The high RI particles further comprise of high index nanoparticles 54 and Polymer 2.

The filler concept described above may be processed differently if nanoparticles are used to prepare high RI materials by adding them to thermoplastic polymer matrices (Polymer 1), which is then added later to another thermoplastic matrix (Polymer 2) to make the opaque composite. These nanoparticles are surface modified and dispersed in thermoplastic Polymer 1 (first polymer). The nanoparticles due to their surface modifications are made compatible with Polymer 1. The surface ligands attached to the nanoparticles may also be reacted with Polymer 1. The opaque polymer composite is made with Polymer 1 and the nanoparticles (HIP or high index polymer) is then blended or alloyed into a low refractive index polymeric material (Polymer 2 or the second polymer). When HIP is dispersed in a matrix of polymer 2 (typically the volume fraction of HIP is less than 50%). These are preferably melt processed at temperatures above the melting points of both polymers 1 and 2. The surface modification of the nanoparticles is engineered so that they are compatible with Polymer 1 and not with Polymer 2. HIP retains the nanoparticles in its own phase and thus keeps a high RI of the dispersed phase. This mixing is done by blending in molten state (e.g., by twin screw extrusion), or in solutions, where the solvents are evaporated after mixing. To control the size of the dispersed phase (HIP), one can add surfactants or a compatibilizer in a controlled amount, e.g., a diblock copolymer with one part compatible with HIP (or comprising of Polymer 1 segment) and the second block compatible with Polymer 2 (or comprising of a block same as Polymer 2). Instead of a diblock copolymer one may also use a graft copolymer with the main chain being Polymer 1 and the graft being Polymer 2 or vice-versa. An advantage of having an organic high RI material in such a composite (or this type of poly-blend or poly-alloy), that the shape of the particles or regions in the dispersed phase of the HIP can be controlled by the processing method (e.g., these can be spherical, rod like, plate like, elliptical, etc). Using compatibilizers to form useful blends of immiscible polymeric materials and controlling of dispersed phase morphology is standard technology (e.g., see the books *Polymer Blends and Alloys* edited by Gabriel O, Shonaike and George P. Simon, Marcell and Dekker, 1999; and *Polymer blends*, Volume 1 and 2, edited by D. R. Paul and C. B. Bucknall, Wiley, 2000). The average size of the dispersed phase is in the range of about 0.2 to 30 microns, and preferably the index difference between the high and the low index polymer is greater than 0.15 units to obtain high degree of opaqueness. For those cases where the dispersed phase is not spherical, at least one of the dimensions (cross-section, length, thickness, etc.) is in this range.

Figure 5B:
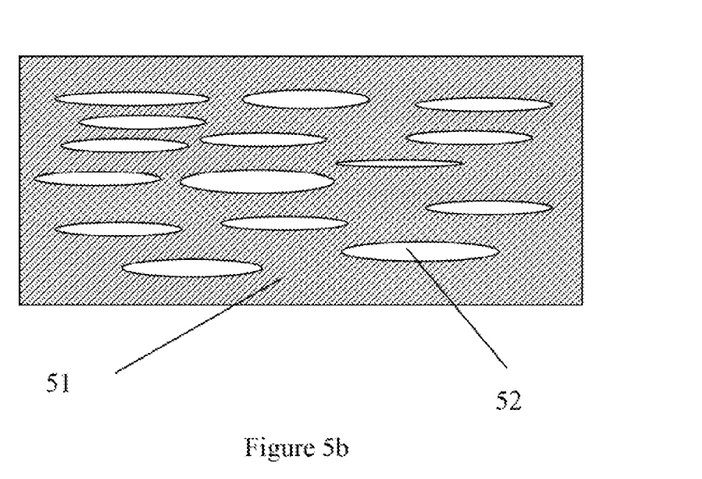

The high index ionic materials (e.g., the ionic liquids or blended with the polymers (Polymer 1) used to solidify them) can also be used as fillers. These can be added to a variety of polymer matrices (Polymer 2) where these ionic materials phase separate into particles as the polymer product is processed such as during cooling or polymerization. To control particle size surfactants (or compatibilizers) that have one end compatible with the polymer matrix (Polymer 2) and the other end compatible with the ionic material may be added in desired proportions. A higher concentration of the compatibilizer will lead to lowering of the phase separated particle sizes. It is preferred that when this route is adopted, the modulus of the embedded particles is lower than that of the matrix (Polymer 1) during processing or even during use, so that the shape and the size of the embedded particles can be controlled by processing during manufacture of the composite or when the final product of the composite is formed. In some cases it is desirable that during processing the embedded particles turn to a liquid state in order to control their size and shape. One may also make high index polymeric cations or anions with appropriate anions and cations respectively. The high index comes from either the anions or the cations or from both. Schematic drawing of the concept of ionic materials as fillers is shown in FIG. 5b. This shows a low index matrix as 51 (or Polymer 1) and high index particles 52 comprising ionic materials and also comprise of Polymer 2.

The refractive index of the high index filler to impart opaqueness should preferably be higher than 0.1 units as compared to the low refractive index matrix it is dispersed in, and more preferably higher than about 0.3. In addition the average size of the high index regions (or particles) distributed in the matrix is about 0.2 to 30 microns so that this results in strong scattering of light, and hence superior hiding power. One may also fill a polymeric matrix with both the high index ionic materials (which may be completely organic materials) and the high index materials with nanoparticles.

Example 1

Preparation of High Index Matrix with Nanoparticles

Some of the preferred high refractive index nano-particle fillers are shown in Table 3. Although a few types of oxide particles are shown, but these could be any oxide, or mixtures of more than one oxide, as long as the RI is suitable for the application at hand. These could be conductive or non-conductive oxides. Some of the conductive oxide nano-particles may comprise antimony, zinc, tin or indium.

TABLE 3

| Material | Manufacture/ Product ID | Dispersion | Particle size | Specific surface area | Index of Refraction | pH | Oxide (wt %) |
|---|---|---|---|---|---|---|---|
| $TiO_2$, $ZnO_2$, $SnO_2$ | Nissan Chemical/ HX-305M5 | Methanol | 10-15 nm | NA | 1.85 | 8.3 | 30.6 |

TABLE 3-continued

| Material | Manufacture/ Product ID | Dispersion | Particle size | Specific surface area | Index of Refraction | pH | Oxide (wt %) |
|---|---|---|---|---|---|---|---|
| $ZrO_2$ | Nissan Chemical/Zr30B and Zr30BL | Aqueous | 4-8 nm | NA | ~2 | 9-11 | 30-41% |
| $ZrO_2$ | Nissan Chemical/Zr30AH and Zr30AL | Aqueous | 6-10 nm | NA | ~2 | 2.5-4.5 | 30-41% |
| $TiO_2$ | Sigma Aldrich/643114 | Aqueous | <40 nm | 20-40 $m^2/g$ | 2.5 | 2-3 | 5.0 |

NA = Not available, Nissan Chemical America Corp (Houston, TX)

The HX-305M5 dispersed particles are silanol treated which allows dispersion in methanol. They have an average particle size between 10 to 15 nm and an index of refraction of 1.85. The dispersion pH is basic at 8.3 and the loading is high at 30.6% solids. The titanium dioxide dispersion is in water without silanol surface treatment. The particle size is less than 40 nm, the pH is acidic at 2-3 and the loading is low at 5 wt % solids. Examples of other nanoparticles from Degussa (Parsippany, N.J.) are VP zirconium oxide 3-YSZ, VP zirconium Oxide pH, Aero Alu C and Aeroxide® $TiO_2$ series such as NK960, T805, W2730X, W740X; and from Ishihara Corp USA (San Francisco, Calif.) TTO-55 series, TTO-51(A), TTO-51(C), and Titania Sol TSK-5. The nanoparticles of titania may be doped with other metal oxides or be coated with amorphous titania or another oxide such as (aluminum oxide, silicon oxide and zirconium oxide) to reduce its catalytic activity when exposed to UV radiation. Many of the products from Ishihara in TTO-55 and TTO-51 series are coated with aluminum oxide or aluminum and zirconium oxide mixture. TSK-5 titania is coated with silica.

For these particles to be incorporated into the organic epoxy matrix they are functionalized. This is achieved through the use of coupling agents such as silanes, titanates and zirconates. The latter two contain atoms of high refractive index which should help maintain a high index matrix. As an example using a silane based coupling agent the particles can be surface treated to give amino functionality by the addition to the nanoparticle dispersion of 3-aminopropyltrimethoxysilane (97% Sigma Aldrich) and water to enhance hydrolysis. The dispersion is stirred at room temperature for 24 hours. The particles are isolated through the use of a rotary evaporation to remove solvent and the dried powder redispersed in the epoxy monomer medium. Variables here will be the amount of amines on the surface of the particle which will affect its reactivity with the epoxy resin. During treatment those silanes which are non-reactive towards the matrix may be blended to tailor the reactivity of the particles to the matrix. This control is required to allow incorporation of particles in the resin without rapid gelation and or crosslinking. The resin may comprise of the epoxy monomers with curing coming in solely from the surface functional groups on nano-particles that react with the epoxy, or also by adding additional curing agents such as amines (aliphatic or aromatic) and anhydrides.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed is:

1. A high refractive index composition comprising an ionic liquid composition, a salt which is soluble in the said ionic liquid composition, and particles of at least one phosphor material, wherein the said high refractive index composition material comprises of a hydrophobic ionic liquid.

2. A high refractive index composition comprising an ionic liquid composition, a polymeric material, and phosphor particles, wherein the said high refractive index composition further comprises nanoparticles of metal oxide.

3. A high refractive index composition comprising an ionic liquid composition, a salt which is soluble in the said ionic liquid composition, and particles of at least one phosphor material, the said high refractive index composition further comprising metal oxide nanoparticles.

* * * * *